United States Patent
Zhang et al.

(10) Patent No.: US 12,144,267 B2
(45) Date of Patent: Nov. 12, 2024

(54) SELECTOR DEVICE AND SEMICONDUCTOR STORAGE DEVICE

(71) Applicant: Kioxia Corporation, Tokyo (JP)

(72) Inventors: Jieqiong Zhang, Yokkaichi Mie (JP); Masatoshi Yoshikawa, Tokyo (JP); Tadaomi Daibou, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 399 days.

(21) Appl. No.: 17/460,898

(22) Filed: Aug. 30, 2021

(65) Prior Publication Data

US 2022/0302383 A1 Sep. 22, 2022

(30) Foreign Application Priority Data

Mar. 22, 2021 (JP) .................. 2021-046830

(51) Int. Cl.
*H10B 63/00* (2023.01)
*H10N 70/00* (2023.01)

(52) U.S. Cl.
CPC .......... *H10N 70/841* (2023.02); *H10B 63/00* (2023.02); *H10N 70/882* (2023.02); *H10N 70/883* (2023.02)

(58) Field of Classification Search
CPC .. H10N 70/841; H10N 70/883; H10N 70/882; H10B 63/00
See application file for complete search history.

(56) References Cited

U.S. PATENT DOCUMENTS

| 9,312,479 | B2 | 4/2016 | Kim | |
|---|---|---|---|---|
| 2007/0181888 | A1* | 8/2007 | Kim | H01L 33/40 |
| | | | | 257/E33.068 |
| 2013/0196169 | A1* | 8/2013 | Boddapati | B22D 23/06 |
| | | | | 428/602 |
| 2016/0163975 | A1* | 6/2016 | Petz | H10N 70/882 |
| | | | | 257/4 |
| 2019/0362785 | A1 | 11/2019 | Hu et al. | |

FOREIGN PATENT DOCUMENTS

TW 201633526 A 9/2016
WO WO-2018/125244 A1 7/2018

OTHER PUBLICATIONS

H. Wang, Y. Xu, M. Shimono, Y. Tanaka and M.Yamazaki "Computation of Interfacial Thermal Resistance by Phonon Diffuse Mismatch Model", Materials Transactions, vol. 48, No. 9 (2007) pp. 2349 to 2352.

* cited by examiner

*Primary Examiner* — Timor Karimy
(74) *Attorney, Agent, or Firm* — Foley & Lardner LLP (57) ABSTRACT

According to one embodiment, a selector device includes a first electrode, a second electrode, and a selector layer disposed between the first electrode and the second electrode. At least one of the first electrode or the second electrode includes a stacked film. The stacked film includes a first layer including a first material with a first Debye temperature, and a second layer in contact with the first layer and including a second material with a second Debye temperature lower than the first Debye temperature. A ratio of the first Debye temperature to the second Debye temperature is equal to or greater than 5.

19 Claims, 8 Drawing Sheets

| MATERIAL | DEBYE TEMPERATURE (°C) | MATERIAL | DEBYE TEMPERATURE (°C) | MATERIAL | DEBYE TEMPERATURE (°C) |
|---|---|---|---|---|---|
| DIAMOND | 1860 | $Fe_{0.92}O$ | 494 | Ag | 215 |
| BN | 1587 | Sc | 476 | Y | 214 |
| C | 1550 | $SiO_2$ | 470 | $CeSn_3$ | 208 |
| B | 1362 | $Ti_2AlN$ | 461 | CdS | 202 |
| BeO | 1260 | Cr | 460 | $Cd_3As_2$ | 200 |
| $TiB_2$ | 1140 | VN | 450 | $ZrSe_3$ | 200 |
| SiC(3C) | 1123 | ZnS | 408 | Sb | 200 |
| LiH | 1115 | Ge | 403 | ZnTe | 198 |
| WC | 1042 | Al | 394 | CdTe | 184 |
| Be | 1031 | V | 390 | Au | 170 |
| $Al_2O_3$ | 980 | ZnO | 387 | BN | 168 |
| MgO | 941 | Co | 386 | Tm | 167 |
| TiN | 865 | Ti | 380 | Sm | 164 |
| TiC | 840 | Ni | 375 | Tb | 158 |
| $TiO_2$ | 780 | $CaF_2$ | 354 | AgBr | 144 |
| $LaB_6$ | 773 | CoPt | 353 | SnTe | 144 |
| $Ti_2AlC$ | 770 | Mg | 318 | Ce | 138 |
| Si | 692 | NiO | 317 | La | 135 |
| ZrC | 650 | Cu | 315 | In | 129 |
| LiF | 645 | W | 310 | MnTe | 122 |
| ZrN | 640 | InSb | 280 | Bi | 120 |
| $MgF_2$ | 626 | $Nb_3Sn$ | 280 | Lu | 116 |
| Si | 625 | $SiGa_2$ | 272 | HgTe | 105 |
| TaC | 610 | GaAs | 264 | Th | 100 |
| WC | 600 | Sn | 254 | K | 100 |
| $ReO_3$ | 560 | Zr | 250 | Tl | 96 |
| CaO | 543 | Ga | 240 | Pb | 88 |
| Rh | 536 | Zn | 237 | Rb | 59 |
| $Ru_{0.2}Ni_{0.8}$ | 531 | Pt | 230 | Cs | 43 |
| HfN | 520 | Ca | 230 | | |
| $CaCO_3$ | 503 | Cd | 221 | | |

FIG. 6

| ELECTRODE MATERIAL | | ELECTRODE MATERIAL | | ELECTRODE MATERIAL | |
|---|---|---|---|---|---|
| T1/T2 RATIO | MATERIAL 1/ MATERIAL 2 | T1/T2 RATIO | MATERIAL 1/ MATERIAL 2 | T1/T2 RATIO | MATERIAL 1/ MATERIAL 2 |
| 1.00 | C BULK | 3.05 | Al/In | 9.50 | $TiB_2$/Bi |
| 1.00 | TiN BULK | 4.02 | TiN/Ag | 10.94 | DLC/Au |
| 1.00 | W BULK | 4.96 | DLC/Ni | 11.07 | DLC/BN |
| 1.00 | DLC BULK | 5.09 | TiN/Au | 12.67 | LiH/Pb |
| 1.67 | Ag/In | 6.00 | DLC/W | 12.95 | $TiB_2$/Pb |
| 1.71 | Al/Pt | 7.05 | DLC/GaAs | 14.42 | DLC/In |
| 1.82 | W/Au | 8.65 | DLC/Ag | 15.25 | DLC/MnTe |
| 1.97 | Si/Mg | 8.84 | $TiB_2$/In | 15.50 | DLC/Bi |
| 2.15 | DLC/TiN | 9.21 | DLC/CdS | 21.14 | DLC/Pb |
| 2.79 | TiN/W | 9.29 | LiH/Bi | | |

SELECTOR DEVICE AND SEMICONDUCTOR STORAGE DEVICE

CROSS-REFERENCE TO RELATED APPLICATION

This application is based upon and claims the benefit of priority from Japanese Patent Application No. 2021-046830, filed Mar. 22, 2021, the entire contents of which are incorporated herein by reference.

FIELD

Embodiments described herein relate generally to selector device and a semiconductor storage device.

BACKGROUND

To transition between ON and OFF states of a variable resistance storage device such as a resistive random access memory (ReRAM), a phase change memory (PCM), and a magnetoresistive random access memory (MRAM), a selector device with a selector layer that changes a phase between the insulator and the conductor by the applied voltage is used. It is generally desired to improve characteristics of enhancing a heat confinement effect of the selector layer in such a selector device.

DETAILED DESCRIPTION

Embodiments provide a selector device and a semiconductor storage device that can improve characteristics of enhancing a heat confinement effect of a selector layer.

In general, according to one embodiment, a selector device includes: a first electrode; a second electrode; and a selector layer disposed between the first electrode and the second electrode. At least one of the first electrode or the second electrode includes a stacked film. The stacked film includes a first layer including a first material with a first Debye temperature, and a second layer in contact with the first layer and including a second material with a second Debye temperature lower than the first Debye temperature. A ratio of the first Debye temperature to the second Debye temperature is equal to or greater than 5.

Hereinafter, the selector device and the semiconductor storage device according to an embodiment are described with reference to drawings. In each embodiment, substantially the same configuration parts may be designated by the same reference numerals, and the description thereof may be partially omitted. The drawings are schematic, and the relationship between the thickness and the plane dimensions, the ratio of the thickness of each part, and the like may differ from the actual ones.

Figure 1:
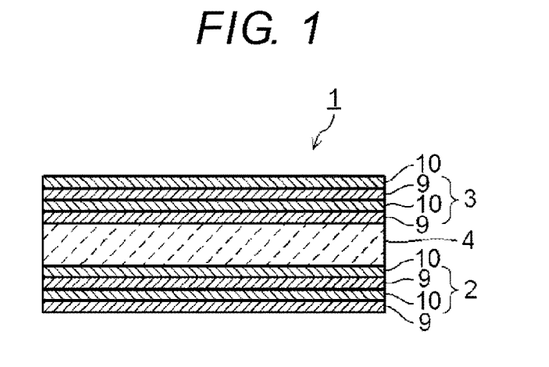
FIG. 1 is a cross-sectional view illustrating a configuration of a selector device according to an embodiment.

FIG. 1 is a cross-sectional view illustrating a configuration of a selector device 1 according to an embodiment. The selector device 1 illustrated in FIG. 1 includes a first electrode 2, a second electrode 3, and a selector layer 4 disposed between the first electrode 2 and the second electrode 3. The selector layer 4 can switch between ON and OFF states of a current flowing through the first electrode 2 and the second electrode 3. The selector layer 4 includes electric characteristics of transitioning to an OFF state in which the resistance value is high when the voltage of less than the threshold value (Vth) is applied and rapidly transitioning from an OFF state in which the resistance value is high to an ON state in which the resistance value is low due to the application of the voltage of the threshold value (Vth) or higher.

If the voltage applied to the selector layer 4 is smaller than the threshold value (Vth), the selector layer 4 functions as an insulator, and thus blocks a current flowing into a functional layer such as a variable resistance layer added to the selector layer 4 to cause functional layer to transition to an OFF state. If the voltage applied to the selector layer 4 is the threshold value (Vth) or higher, the resistance value of the selector layer 4 rapidly decreases and functions as a conductor, so that the current flows into the functional layer via the selector layer 4. The selector device 1 with the selector layer 4 is applied to the on and off control of the current to the functional layer, for example, in the various electronic devices.

Figure 2:
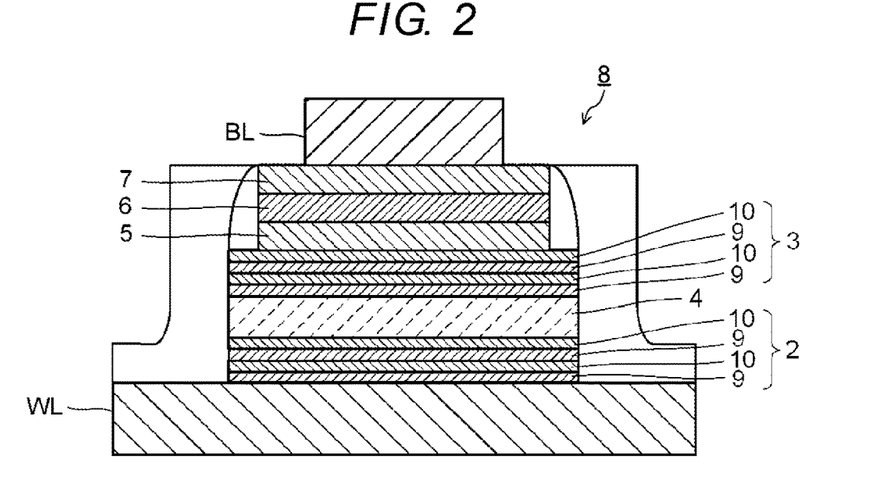
FIG. 2 is a cross-sectional view of a configuration of a variable resistance semiconductor storage device by using the selector device according to the embodiment.

For example, as illustrated in FIG. 2, the selector device 1 illustrated in FIG. 1 is applied to a variable resistance semiconductor storage device 8 including the first electrode 2, the second electrode 3, the selector layer 4, a third electrode 5, a variable resistance layer 6 that functions a nonvolatile memory layer, and a fourth electrode 7. The third electrode 5 and the fourth electrode 7 may be omitted. Here, a stacked film of the selector layer 4 and the variable resistance layer 6 is used, the first electrode 2 and the second electrode 3 function as a pair of electrodes with respect to the stacked film of the selector layer 4 and the variable resistance layer 6. The above stacked film may be a structure in which the selector layer 4 and the variable resistance layer 6 are directly stacked or may be a structure in which another layer such as an intermediate layer or an additional layer is interposed therebetween. The variable resistance layer 6 may be stacked on the selector layer 4 directly or via another layer and also electrically connected to the selector layer 4.

Figure 3:
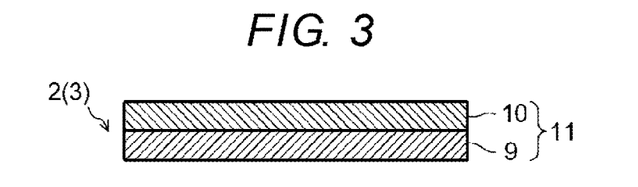
FIG. 3 is a cross-sectional view illustrating a configuration of a first example of an electrode used in the selector device illustrated in FIG. 1.

As illustrated in FIG. 2, the first electrode 2 of the variable resistance semiconductor storage device 8 is electrically connected to a word line WL, and the fourth electrode 7 electrically connected to a bit line BL. The variable resistance semiconductor storage device 8 is disposed at an intersection between the word line WL and the bit line BL which intersect each other and functions as a memory cell of the semiconductor storage device. In FIG. 3, only one variable resistance semiconductor storage device 8 is illustrated, but in practice, the variable resistance semiconductor storage devices 8 are arranged at the intersections of the plurality of bit lines BL and the plurality of word lines WL as memory cells, to configure a cross point-type semiconductor storage device.

As the selector layer 4 of the selector device 1, a material (selector material) with electric characteristics of transitioning to an OFF state in which the resistance value is high when the voltage applied as above is less than the threshold value (Vth) and rapidly transitioning to an OFF state in which the resistance value is high to an ON state in which the resistance value is low when the voltage is the threshold value (Vth) or higher. The specific selector material is not particularly limited. Examples of the selector material include a material including at least one chalcogen element selected from the group consisting of tellurium (Te), selenium (Se), and sulfur (S). Such a selector material may include chalcogenide which is a chalcogenide including a chalcogen element.

The material including the chalcogen element may include at least one element selected from the group consisting of aluminum (Al), gallium (Ga), indium (In), silicon (Si), germanium (Ge), tin (Sn), arsenic (As), phosphorus (P), and antimony (Sb), and bismuth (Bi). The material including the chalcogen element may include at least one element selected from the group consisting of nitrogen (N), oxygen (O), carbon (C), and boron (B). Examples of the selector material include GeSbTe, GeTe, SbTe, SiTe, AlTeN, and GeAsSe. However, the selector material is not limited to a material including a chalcogen element and may be a material not including a chalcogen element. The selector layer 4 may include an amorphous structure.

As the variable resistance layer 6, a memory layer in a variable resistance memory is used. As the variable resistance memory, a resistive random access memory (ReRAM), a phase change memory (PCM), a magnetoresistive random access memory (MRAM) and the like are known. The memory layers of various variable resistance memories are used as the variable resistance layer 6. The variable resistance layer 6 is not limited to a single layer structure, and may be a multilayer film required to exhibit functions of each memory. The selector device 1 is not limited to the variable resistance semiconductor storage device 8 and may be used in selectors of various electronic devices.

In the variable resistance semiconductor storage device 8 as illustrated in FIG. 2, the selector layer (switching layer) 4 is electrically connected to the variable resistance layer 6, and includes a function of switching ON and OFF states of the current to the variable resistance layer 6. If the voltage applied to the selector layer 4 is lower than the threshold value (Vth), the selector layer 4 functions as an insulator and blocks the current flowing to the variable resistance layer 6 to cause the variable resistance layer 6 to transition to an OFF state. If the voltage applied to the selector layer 4 exceeds the threshold value (Vth), the resistance value of the selector layer 4 rapidly decreases and functions as a conductor, and thus the current flows to the variable resistance layer 6 via the selector layer 4, to enable the write or read operation of the variable resistance layer 6. The selector device 1 includes a function of switching the ON and OFF states of the variable resistance layer 6 as the memory layer in the variable resistance semiconductor storage device (variable resistance memory) 8.

Figure 4:
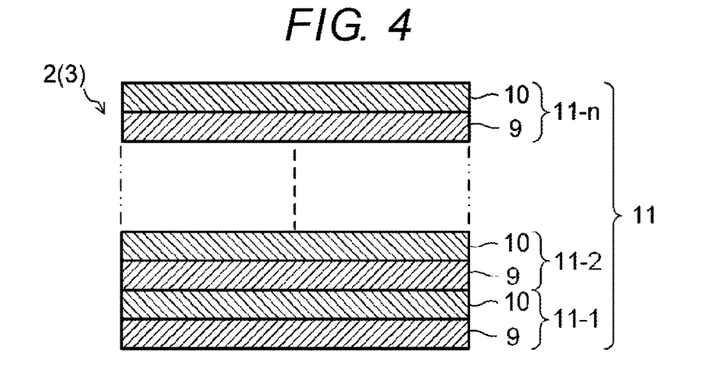
FIG. 4 is a cross-sectional view illustrating a configuration of a second example of an electrode used in the selector device illustrated in FIG. 1.

As illustrated in FIG. 3, in the above selector device 1, the first electrode 2 and the second electrode 3 each include a stacked film 11 in which a first layer 9 including a first material and a second layer 10 including a second material are in contact with each other. The first material including the first layer 9 includes a first Debye temperature (T1). The second material in the second layer 10 includes a second Debye temperature (T2) lower than the first Debye temperature (T1). The stacked film 11 is not limited to a structure in which the first layer 9 and the second layer 10 are stacked one by one as illustrated in FIG. 3, and for example, may be a structure in which the stacked film 11 including the first layer 9 and the second layer 10 is repeatedly stacked as illustrated in FIG. 4. FIG. 4 illustrates a state (a state in which films from the first stacked film 11-1 to an n-th stacked film 11-n are stacked) in which a second stacked film 11-2 including the first layer 9 and the second layer 10 is stacked on a first stacked film 11-1 including the first layer 9 and the second layer 10, and such stacking of the stacked film 11 is repeated n times. The number of repetitions of stacking the stacked films 11 illustrated in FIG. 4 is referred to as a number of repetitions of stacking layers n of the first layer 9 and the second layer 10.

The stacked film 11 is not limited to a stacked structure in which the second layer 10 is disposed on the first layer 9 as illustrated in FIG. 3. FIG. 1 illustrates a structure in which the first layer 9, the second layer 10, the first layer 9, the second layer 10, the selector layer 4, the first layer 9, the second layer 10, the first layer 9, and the second layer 10 are sequentially stacked. The embodiment is not limited thereto, and may be a structure in which the first layer 9, the second layer 10, the first layer 9, the second layer 10, the selector layer 4, the second layer 10, the first layer 9, the second layer 10, and the first layer 9 are sequentially stacked, a structure in which the second layer 10, the first layer 9, the second layer 10, the first layer 9, the selector layer 4, the first layer 9, the second layer 10, the first layer 9, and the second layer 10 are sequentially stacked, and a structure in which the second layer 10, the first layer 9, the second layer 10, the first layer 9, the selector layer 4, the second layer 10, the first layer 9, the second layer 10, and the first layer 9 are sequentially stacked. The layer that is in contact with the selector layer 4 may be any one of the first layer 9 or the second layer 10. In the same manner, the number of times of stacking the stacked films 11 as illustrated in FIG. 4 may be set as n.

The stacked film 11 including the first layer 9 and the second layer 10 is applied to at least one of the first electrode 2 and the second electrode 3. For example, the electrode layer with the stacked film 11 is applied to the first electrode 2, and the electrode layer of the single layer structure is applied to the second electrode 3. The opposite structure may be applied. As the electrode layer with a single layer structure, a carbon layer such as a diamond-like carbon layer, a graphene layer, a carbon nanotube layer, a fullerene layer, a metal layer such as a tungsten (W) layer, a copper (Cu) layer, an aluminum layer (Al), or an alloy layer including at least one of these elements, a compound layer such as a titanium nitride (TiN) layer or a titanium boride (TiB) layer, and the like are applied. However, as described below, the electrode layer with the stacked film 11 has an excellent heat confinement effect, and thus is preferably applied to both of the first electrode 2 and the second electrode 3.

If the stacked film 11 including the first layer 9 that includes a first material with the first Debye temperature (T1) and the second layer 10 that includes a second material with the second Debye temperature (T2: T2<T1) lower than the first Debye temperature (T1) is applied to the first electrode 2 and the second electrode 3, an interface thermal resistance Rinterface is generated on a boundary surface (contact surface) between the first layer 9 and the second layer 10 that have different Debye temperatures is generated, and thus a higher thermal resistance is expected.

A thermal resistance of the first layer 9 is set as R1, a thermal resistance of the second layer 10 is set as R2, and a thermal resistance at the stacking interface of the first layer 9 and the second layer 10 is set as Rinterface, a total thermal resistance (Rtotal) of the stacked film 11 in which the first layer 9 and the second layer 10 are stacked one by one is expressed by Expression (1).

$$Rtotal=R1+R2+Rinterface \quad (1)$$

The total thermal resistance Rtotal of the stacked film 11 in which stacking of the first layer 9 and the second layer 10 is repeated n times is expressed by Expression (2).

$$Rtotal=R1 \times n+R2 \times n+Rinterface \times (2n-1) \quad (2)$$

As expressed in Expression (1) or (2), the total thermal resistance (Rtotal) of the stacked film 11 greatly contributes to the size of the interface thermal resistance (Rinterface) or the number of the interface thermal resistances (Rinterface). It is considered that the size of the interface thermal resistance (Rinterface) is derived from a ratio of the first Debye temperature (T1) to the second Debye temperature (T2) (T1/T2 ratio) or the like. As the Debye temperature ratio (T1/T2 ratio) increases, the interface thermal resistance (Rinterface) increases. Here, as the total thermal resistance (Rtotal) of the stacked film 11 increases, the heat confinement effect of the selector layer 4 can be strengthened. By causing the heat confinement effect of the selector layer 4 to be strengthened, the threshold voltage (Vth), a threshold value current (Ith), and a voltage (Vhold) in case of transitioning to an ON state with respect to the selector device 1 and the like can be decreased, and thus the current ratio can be greatly decreased. When obtaining the heat confinement effect of the selector layer 4, it is important to enhance the total thermal resistance (Rtotal) of the first electrode 2 and the second electrode 3 around the selector layer 4.

With respect to the Debye temperature ratio of the first layer 9 and the second layer 10 of the stacked film 11, the ratio of the first Debye temperature (T1) of the first layer 9 to the second Debye temperature (T2) of the second layer 10 (T1/T2 ratio) is effectively 5 or more. Since the Debye temperature ratio (T1/T2 ratio) is 5 or more, the total thermal resistance (Rtotal) of the stacked film 11 can be sufficiently enhanced. With respect to the number of repetitions of stacking layers n of the first layer 9 and the second layer 10 in the stacked film 11, the number of repetitions of stacking layers n is effectively 4 or more. By causing the number of repetitions of stacking layers n of the first layer 9 and the second layer 10 to be 4 or more, the total thermal resistance (Rtotal) of the stacked film 11 can be sufficiently enhanced.

The Debye temperature ratio (T1/T2 ratio) and the number of repetitions of stacking layers n may be satisfied respectively or both may be satisfied. Even if the number of repetitions of stacking layers n of the first layer 9 and the second layer 10 is less than 4 (for example, n=1), if the Debye temperature ratio (T1/T2 ratio) is 5 or more, the total thermal resistance (Rtotal) of the stacked film 11 can be sufficiently enhanced. In contrary, even if the Debye temperature ratio (T1/T2 ratio) is less than 5, the number of repetitions of stacking layers n of the first layer 9 and the second layer 10 is caused to be 4 or more, the total thermal resistance (Rtotal) of the stacked film 11 can be sufficiently enhanced. It is preferable to satisfy both of the Debye temperature ratio (T1/T2 ratio) and the number of repetitions of stacking layers n.

Figure 5:
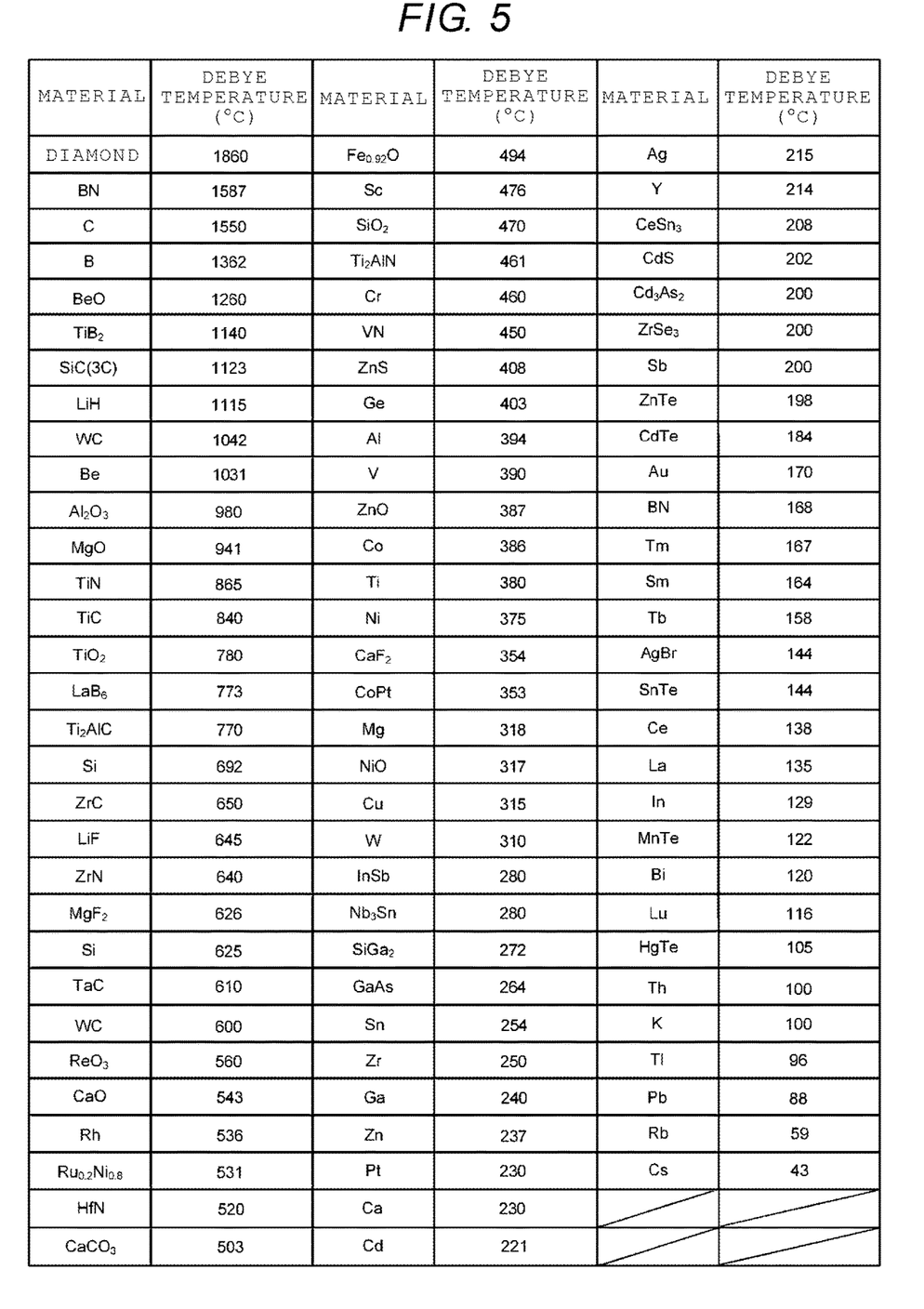
FIG. 5 is a table showing Debye temperatures of various materials.
Figure 6:
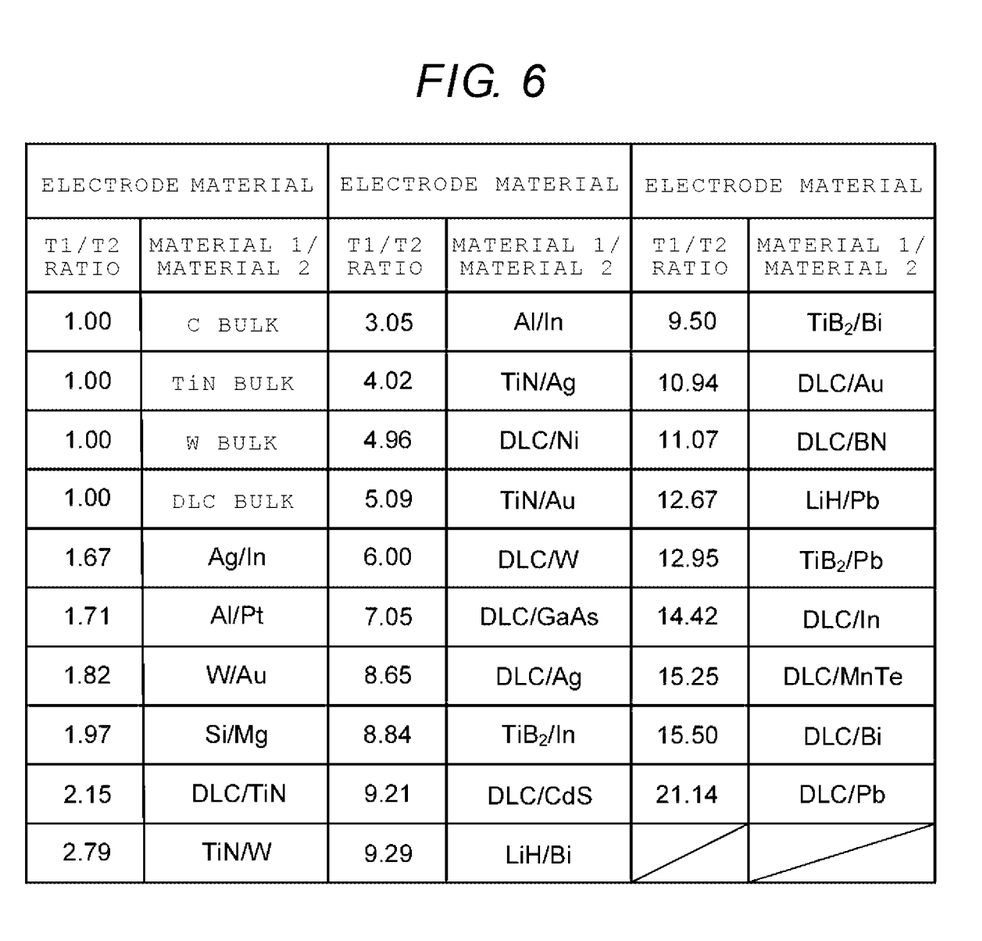
FIG. 6 is a table showing Debye temperature ratios (T1/T2) of the first material and the second material.

Subsequently, the Debye temperature ratio (T1/T2 ratio) of the first layer 9 and the second layer 10 of the stacked film 11 is described with reference to FIGS. 5 to 9. The Debye temperatures of representative materials are shown in FIG. 5. As shown in FIG. 5, the Debye temperature is a value determined by a material. FIG. 6 shows combinations of the first materials (materials 1) with the first Debye temperatures (T1) and the second materials (materials 2) with the second Debye temperatures (T2) and Debye temperature ratios of the combinations (T1/T2 ratios). FIG. 6 shows bulk materials used in an electrode as a reference material, that is, a carbon bulk, a TiN bulk, a W bulk, and a diamond-like carbon (DLC) bulk. Such bulk materials are single substance materials, and thus the Debye temperature ratio (T1/T2 ratio) is 1.

Figure 7:
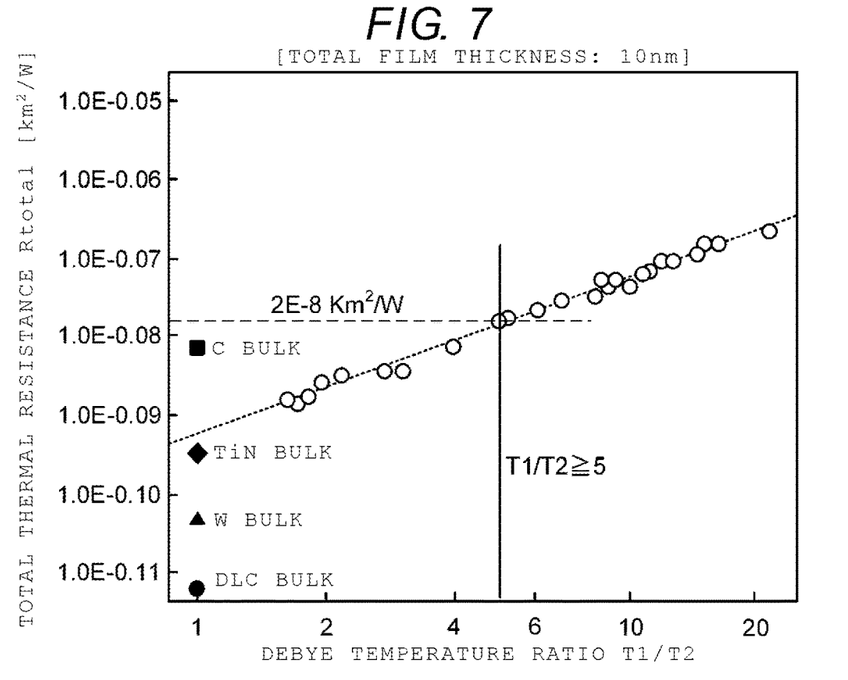
FIG. 7 is a diagram illustrating a relationship between the Debye temperature ratio and the total thermal resistance in a stacked film of a first material and a second material.
Figure 8:
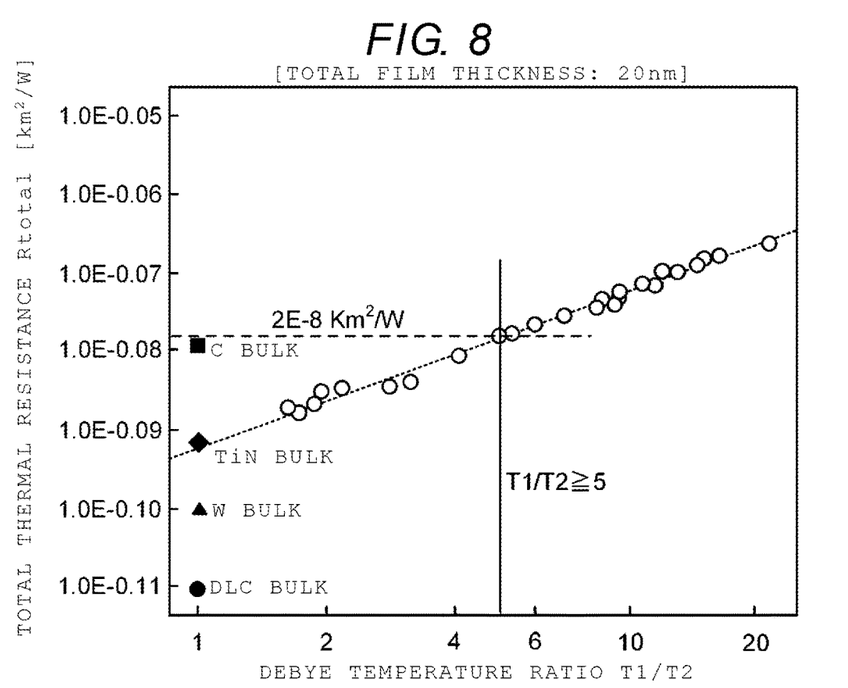
FIG. 8 is a diagram illustrating a relationship between the Debye temperature ratio and the total thermal resistance in the stacked film of the first material and the second material.
Figure 9:
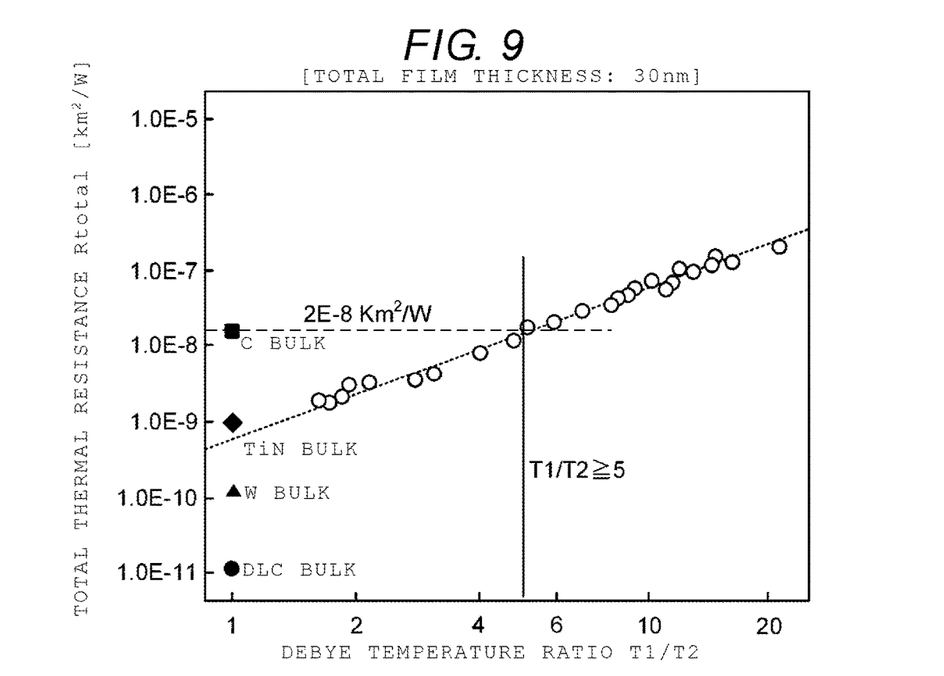
FIG. 9 is a diagram illustrating a relationship between the Debye temperature ratio and the total thermal resistance of the stacked film of the first material and the second material.

FIGS. 7, 8, and 9 illustrate relationships between the Debye temperature ratios (T1/T2 ratios) and the total thermal resistances (Rtotal) of the stacked film obtained by stacking the first material (the material 1) layer and the second material (the material 2) layer illustrated in FIG. 6. FIG. 7 illustrates values of the total thermal resistances (Rtotal) when the total film thickness of the stacked film is 10 nm. FIG. 8 illustrates values of the total thermal resistances (Rtotal) when the total film thickness of the stacked film is 20 nm. FIG. 9 illustrates values of the total thermal resistances (Rtotal) when the total film thickness of the stacked film is 30 nm. As illustrated in FIGS. 7, 8, and 9, it is understood that, as the Debye temperature ratio (T1/T2 ratio) of the first layer 9 and the second layer 10 increases, the value of the total thermal resistance (Rtotal) increases. In FIGS. 7, 8, and 9, the total thermal resistance (Rtotal) of the carbon bulk layer with the total film thickness of 30 nm is illustrated with broken lines. Among the bulk materials, the total thermal resistance (Rtotal) with the film thickness of 30 nm carbon bulk layer is the largest, and is $2 \times 10^{-8}$ km²/W.

As illustrated in FIG. 7, with respect to the stacked film (total film thickness: 10 nm) 11 of the first material and the second material of which the Debye temperature ratio (T1/T2 ratio) is 5 or more, it is possible to obtain the total thermal resistance (Rtotal) higher than $2 \times 10^{-8}$ km²/W which is the total thermal resistance (Rtotal) of the carbon bulk layer with the film thickness of 30 nm. The total thermal resistance (Rtotal) of the stacked film 11 increases as the Debye temperature ratio (T1/T2 ratio) of the first material and the second material increases, and thus the heat confinement effect of the selector layer 4 by the first electrode 2 and the second electrode 3 using the stacked film 11 can be strengthened. Therefore, the characteristics of the selector device 1 can be improved by using the electrodes 2 and 3.

As illustrated in FIGS. 8 and 9, the improvement effect of the total thermal resistance (Rtotal) of the stacked film 11 of the first material and the second material by the Debye temperature ratio (T1/T2 ratio) can be obtained in the same manner in a case where the total film thickness of the stacked film 11 is 20 nm, or the total film thickness of the stacked film 11 is 30 nm. In order to obtain the improvement effect of the total thermal resistance (Rtotal), the total film thickness of the stacked film 11 of the first layer 9 and the second layer 10 is preferably 10 nm to 30 nm. If the total film thickness of the stacked film 11 is less than 10 nm, the sufficient total thermal resistance (Rtotal) cannot be obtained. If the total film thickness of the stacked film 11 exceeds 30 nm, the electrodes 2 and 3 of the selector device 1 can be increased, and the requirement characteristics of the selector device 1 cannot be satisfied. The respective film thicknesses of the first layer 9 and the second layer 10 that configure the stacked film 11 is preferably 0.5 nm or more. If the film thickness of the first layer 9 or the second layer 10 is less than 0.5 nm, there is a concern in that the functions of the layers 9 and 10 or the functions at the interfaces thereof cannot be sufficiently obtained.

As the first material, nitride including at least one selected from the group consisting of boron (B), titanium (Ti), zirconium (Zr), hafnium (Hf), aluminum (Al), and vanadium (V), carbide including at least one selected from the group consisting of silicon (Si), tungsten (W), titanium (Ti), zirconium (Zr), aluminum (Al), tantalum (Ta), tungsten (W), and calcium (Ca), boride including at least one selected from the group consisting of titanium (Ti) and lanthanum (La), fluoride including at least one selected from the group consisting of magnesium (Mg), lithium (Li), and calcium (Ca), oxide including at least one selected from the group consisting of aluminum (Al), beryllium (Be), magnesium (Mg), titanium (Ti), renium (Re), calcium (Ca), iron (Fe), silicon (Si), zinc (Zn), nickel (Ni), and ruthenium (Ru), and the like may be used. The first material may include at least one selected from the group consisting of beryllium (Be), silicon (Si), rhodium (Rh), scandium (Sc), chromium (Cr), sulfur (S), germanium (Ge), aluminum (Al), vanadium (V), cobalt (Co), titanium (Ti), nickel (Ni), magnesium (Mg), copper (Cu), tungsten (W), tin (Sn), zirconium (Zr), gallium (Ga), zinc (Zn), platinum (Pt), calcium (Ca), cadmium (Cd), and silver (Ag), and for example, such a metal material thereof is used. The second material may include at least one selected from the group consisting of cobalt (Co), platinum (Pt), magnesium (Mg), copper (Cu), tungsten (W), indium (In), antimony (Sb), niobium (Nb), tin (Sn), strontium (Sr), gallium (Ga), arsenic (As), zirconium (Zr), zinc (Zn), calcium (Ca), silver (Ag), yttrium (Y), cerium (Ce), sulfur (S), antimony (Sb), tellurium (Te), gold (Au), thulium (Tm), samarium (Sm), terbium (Tb), bromine (Br), indium (In), manganese (Mn), bismuth (Bi), lutetium (Lu), mercury (Hg), thorium (Th), potassium (K), thallium (Tl), lead (Pb), rubidium (Rb), and cesium (Cs), and for example, such a metal material or a compound material is used. The combination of the first material and the second material is selected to satisfy the above conditions based on the Debye temperatures of the materials.

Figure 10:
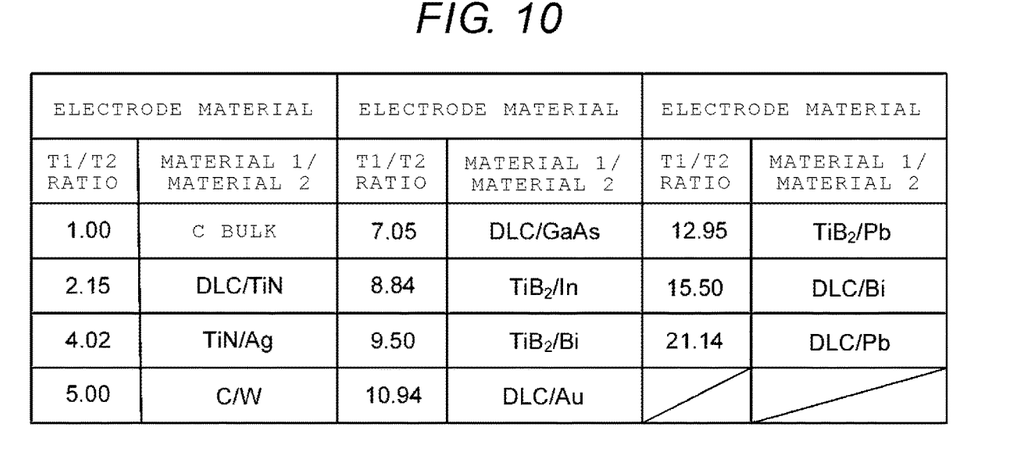
FIG. 10 is a diagram illustrating a Debye temperature ratio (T1/T2) of the first material and the second material.

The number of repetitions of stacking layers n of the first layer 9 and the second layer 10 in the stacked film 11 is described with reference to FIGS. 10 to 13. FIG. 10 shows the combinations of the first materials (the materials 1) with the first Debye temperatures (T1) and the second materials (the materials 2) with the second Debye temperatures (T2), and the Debye temperature ratios (T1/T2 ratios) in the respective combinations. FIG. 6 shows a carbon bulk of which the Debye temperature ratio (T1/T2 ratio) is 1, as the reference material.

Figure 11:
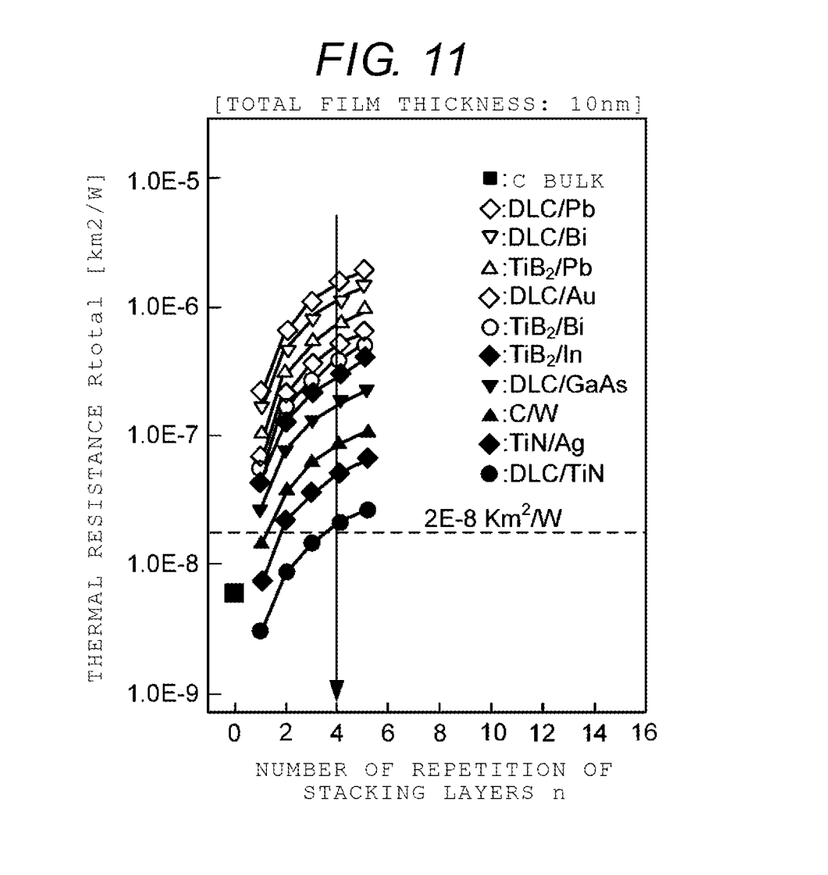
FIG. 11 is a diagram illustrating a relationship between the number of repetitions of stacking layers and the total thermal resistance with respect to the stacked film of the first material and the second material.
Figure 12:
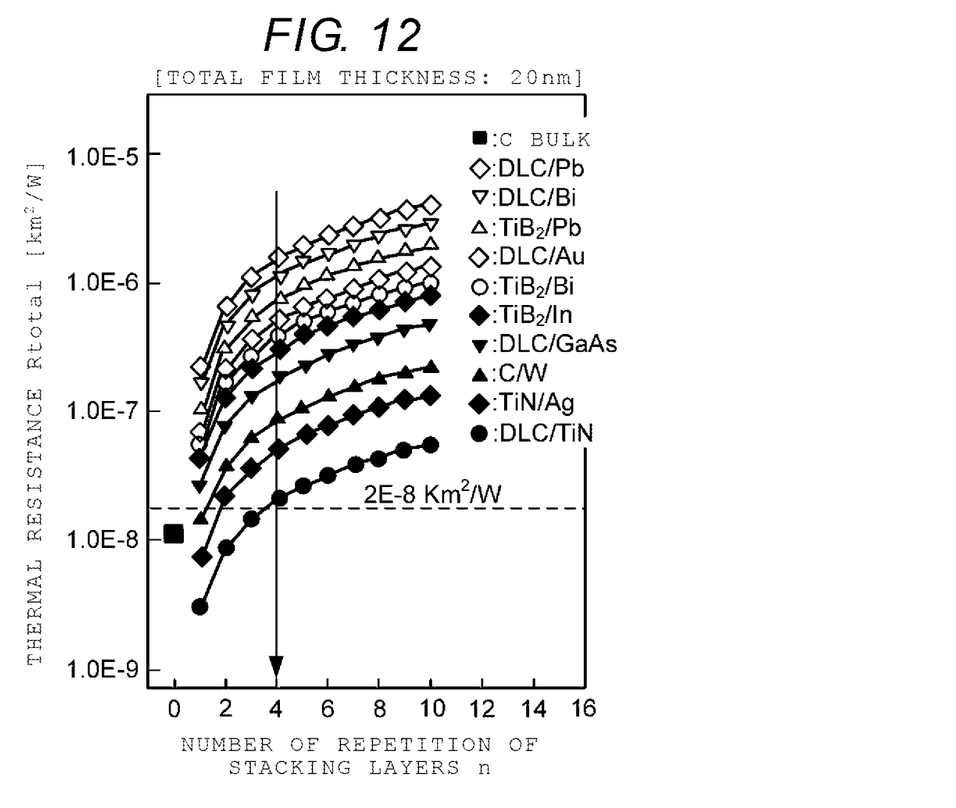
FIG. 12 is a diagram illustrating a relationship between the number of repetitions of stacking layers and the total thermal resistance with respect to the stacked film of the first material and the second material.
Figure 13:
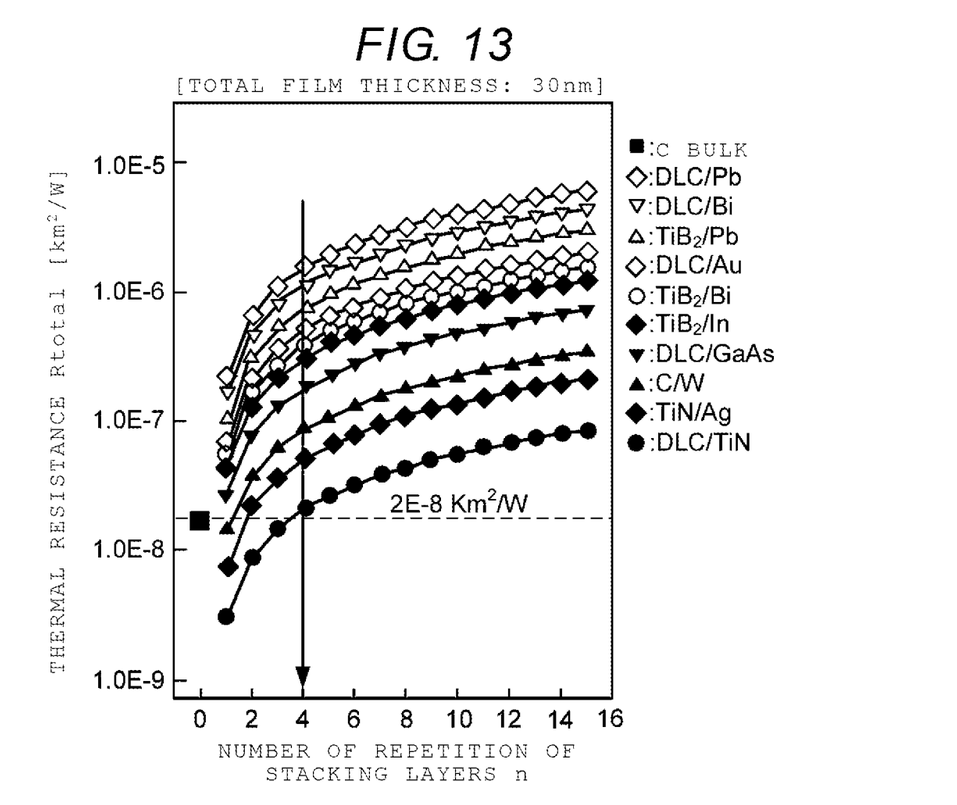
FIG. 13 is a diagram illustrating a relationship between the number of repetitions of stacking layers and the total thermal resistance with respect to the stacked film of the first material and the second material.

As illustrated in FIGS. 11, 12, and 13, relationships between the number of repetitions of stacking layers n including layers of the first materials (the materials 1) and layers of the second material (the material 2) illustrated in FIG. 10 and the values of the total thermal resistance (Rtotal). FIG. 11 illustrates values of the total thermal resistance (Rtotal) when the total film thickness of the stacked film is 10 nm. FIG. 12 illustrates values of the total thermal resistance (Rtotal) when the total film thickness of the stacked film is 20 nm. FIG. 13 illustrates values of the total thermal resistance (Rtotal) when the total film thickness of the stacked film is 30 nm. As illustrated in FIGS. 11, 12, and 13, it is understood that, as the number of repetitions of stacking layers n of the first layer 9 and the second layer 10 increases, values of the total thermal resistance (Rtotal) increase. In FIGS. 11, 12, and 13, $2 \times 10^{-8}$ is km$^2$/W which is the total thermal resistance (Rtotal) of the carbon bulk layer with the film thickness of 30 nm is illustrated with broken lines.

As illustrated in FIG. 11, by the stacked film (total film thickness: 10 nm) 11 of the first material and the second material in which the number of repetitions of stacking layers n of the first layer 9 and the second layer 10 is 4 or more, it is possible to obtain the total thermal resistance (Rtotal) higher than $2 \times 10^{-8}$ km$^2$/W which is the total thermal resistance (Rtotal) of the carbon bulk layer with the film thickness of 30 nm. The total thermal resistance (Rtotal) of the stacked film 11 increases as the number of repetitions of stacking layers n of the first layer 9 and the second layer 10 increases. The improvement effect of the total thermal resistance (Rtotal) based on the number of repetitions of stacking layers n can be obtained by causing the number of repetitions of stacking layers n to be 4 or more even if the Debye temperature ratio (T1/T2 ratio) is less than 5. By using the stacked film 11 of which the total thermal resistance (Rtotal) is increased based on the number of repetitions of stacking layers n in the first electrode 2 and the second electrode 3, the heat confinement effect of the selector layer 4 is strengthened, and the characteristics of the selector device 1 can be improved.

As illustrated in FIGS. 12 and 13, the improvement effect of the total thermal resistance (Rtotal) of the stacked film 11 based on the number of repetitions of stacking layers n of the first layer 9 and the second layer 10 can be obtained in the same manner also if the total film thickness of the stacked film 11 is 20 nm, or the total film thickness of the stacked film 11 is 30 nm. Even if the total film thickness is 20 nm, the total film thickness of the stacked film 11 is 30 nm, or the Debye temperature ratio (T1/T2 ratio) is less than 5, if the number of repetitions of stacking layers n is 4 or more, the improvement effect of the total thermal resistance (Rtotal) of the stacked film 11 can be obtained. In order to obtain the improvement effect of the total thermal resistance (Rtotal), the total film thickness of the stacked film 11 of the first layer 9 and the second layer 10 is preferably 10 nm to 30 nm. If the total film thickness of the stacked film 11 is less than 10 nm, the sufficient total thermal resistance (Rtotal) cannot be obtained. If the total film thickness of the stacked film 11 exceeds 30 nm, the electrodes 2 and 3 of the selector device 1 become too thick, and thus the requirement characteristics of the selector device 1 are not satisfied. The film thicknesses of the first layer 9 and the second layer 10 that configure the stacked film 11 are preferably 0.5 nm or more. If the film thickness of the first layer 9 or the second layer 10 is less than 0.5 nm, it is concerned in that the functions of the layers 9 and 10 or the functions at the interfaces thereof cannot be sufficiently obtained.

As described above, by applying the stacked film 11 that satisfies at least one of a condition in which the Debye temperature ratio (T1/T2 ratio) of the first layer 9 and the second layer 10 is 5 or more (first condition) and a condition in which the number of repetitions of stacking layers n of the first layer 9 and the second layer 10 is 4 or more (second condition) to at least one of the first electrode 2 and the second electrode 3, the total thermal resistance (Rtotal) of the first electrode 2 and the second electrode 3 can be enhanced. By enhancing the heat confinement effect of the selector layer 4 based on the total thermal resistance (Rtotal) of the first electrode 2 and the second electrode 3 to be strengthened, characteristics based on the threshold voltage (Vth), the threshold value current (Ith), and the voltage (Vhold) in case of transitioning to an ON state with respect to the selector device 1 and the like can be improved. In order to enhance the heat confinement effect of the selector layer 4, both of the first and second conditions of the stacked film 11 are preferably satisfied. The stacked film 11 satisfying at least one of the first and second conditions and the stacked film 11 satisfying the first and second conditions are preferably applied to both of the first electrode 2 and the second electrode 3.

With respect to the first material applied to the first layer 9 and the second material applied to the second layer 10 of the stacked film 11, the Debye temperature ratio (T1/T2 ratio) of the first layer 9 and the second layer 10 may be 5 or more if the first condition is satisfied, and the Debye temperature ratio (T1/T2 ratio) is not particularly limited if the second condition is satisfied. The materials and the combinations of the materials as shown in the tables of FIGS. 5, 6, and 10 may be used as the first material and the second material. Considering the characteristics required to the electrodes, the first material preferably includes at least one selected from the group consisting of carbon (C), titanium nitride (TiN), and titanium boride (TiB). The second material preferably includes at least one selected from the group consisting of tellurium (Te), gold (Au), silver (Ag), lead (Pb), bismuth (Bi), indium (In), tungsten (W), and manganese (Mn). Examples of the carbon used in the first material include diamond-like carbon, graphene, graphite, carbon nanotubes, fullerenes, and amorphous carbon, and are not particularly limited. The second material is not limited to include the above elements as single substances, but may include a compound or an alloy including at least one of the elements described above such as telluride such as MnTe or SnTe or selenide such as ZrSe.

The selector device 1 according to the embodiment includes the first electrode 2 and the second electrode 3 applied with the electrode layer applied with the stacked film 11 that satisfies at least one of a condition that the Debye temperature ratio (T1/T2 ratio) of the first layer 9 and the second layer 10 is 5 or more (the first condition) and a condition that the number of repetitions of stacking layers n of the first layer 9 and the second layer 10 is 4 or more (the second condition). It is possible to provide the selector device 1 in which the heat confinement effect of the selector layer 4 is strengthened based on the total thermal resistance (Rtotal) of the stacked film 11 applied to at least one of the first electrode 2 and the second electrode 3. Therefore, the characteristics of the selector device 1 are improved, and further the characteristics or the reliability of the variable resistance semiconductor storage device 8 using the selector device 1 can be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A selector device comprising:
   a first electrode;
   a second electrode; and
   a selector layer disposed between the first electrode and the second electrode, wherein
   at least one of the first electrode or the second electrode includes a stacked film, wherein the stacked film includes:
   a first layer including a first material with a first Debye temperature; and
   a second layer in contact with the first layer and including a second material with a second Debye temperature lower than the first Debye temperature,
   wherein a ratio of the first Debye temperature to the second Debye temperature is equal to or greater than 5, and
   wherein the stacked film includes the first layer and the second layer that are repetitively stacked at least 4 times.

2. The selector device according to claim 1, wherein a total film thickness of the stacked film is between about 10 nm to about 30 nm.

3. The selector device according to claim 1, wherein a film thicknesses of each of the first layer and the second layer is not less than about 0.5 nm.

4. The selector device according to claim 1, wherein the first material includes at least one of carbon, titanium nitride, or titanium borohydride, and the second material includes at least one of tellurium, gold, silver, lead, bismuth, indium, tungsten, or manganese.

5. The selector device according to claim 1, wherein the first material is a nitride of at least one of boron, titanium, zirconium, hafnium, aluminum, or vanadium.

6. The selector device according to claim 1, wherein the first material is a carbide of at least one of silicon, tungsten, titanium, zirconium, aluminum, tantalum, tungsten, or calcium.

7. The selector device according to claim 1, wherein the first material is a boride of at least one of titanium or lanthanum.

8. The selector device according to claim 1, wherein the first material is a fluoride of at least one of magnesium, lithium, or calcium.

9. The selector device according to claim 1, wherein the first material is at least one of aluminum, beryllium, magnesium, titanium, rhenium, calcium, iron, silicon, zinc, nickel, or ruthenium.

10. The selector device according to claim 1, wherein the first material includes at least one of beryllium, silicon, rhodium, scandium, chromium, sulfur, germanium, aluminum, vanadium, cobalt, titanium, nickel, magnesium, copper, tungsten, tin, zirconium, gallium, zinc, platinum, calcium, cadmium, or silver.

11. The selector device according to claim 1, wherein the second material includes at least one of cobalt, platinum, magnesium, copper, tungsten, indium, antimony, niobium, tin, strontium, gallium, arsenic, zirconium, zinc, calcium, cadmium, silver, yttrium, cerium, sulfur, antimony, tellurium, gold, thulium, samarium, terbium, bromine, indium, manganese, bismuth, lutetium, mercury, thorium, potassium, thallium, lead, rubidium, or cesium.

12. The selector device according to claim 1, wherein the first electrode and the second electrode each include a portion of the stacked film.

13. A semiconductor storage device comprising:
the selector device according to claim 1; and
a variable resistance layer that is electrically connected to the selector layer of the selector device and is stacked with the selector layer.

14. A selector device comprising:
a first electrode;
a second electrode; and
a selector layer disposed between the first electrode and the second electrode, wherein
at least one of the first electrode or the second electrode includes a stacked film, wherein the stacked film includes:
  a first layer including a first material with a first Debye temperature; and
  a second layer in contact with the first layer and including a second material with a second Debye temperature lower than the first Debye temperature,
wherein the stacked film includes the first layer and the second layer that are repetitively stacked at least 4 times.

15. The selector device according to claim 14, wherein a total film thickness of the stacked film is between about 10 nm to about 30 nm.

16. The selector device according to claim 14, wherein a film thicknesses of each of the first layer and the second layer is not less than 0.5 nm.

17. The selector device according to claim 14, wherein the first material includes at least one of carbon, titanium nitride, and titanium borohydride, and the second material includes at least one selected from the group consisting of tellurium, gold, silver, lead, bismuth, indium, tungsten, or manganese.

18. The selector device according to claim 14, wherein the first electrode and the second electrode each include a portion of the stacked film.

19. A semiconductor storage device comprising:
the selector device according to claim 14; and
a variable resistance layer that is electrically connected to the selector layer of the selector device and is stacked with the selector layer.

* * * * *